(12) United States Patent
Tihanyi

(10) Patent No.: US 6,376,890 B1
(45) Date of Patent: Apr. 23, 2002

(54) HIGH-VOLTAGE EDGE TERMINATION FOR PLANAR STRUCTURES

(75) Inventor: Jenoe Tihanyi, Kirchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/457,225

(22) Filed: Dec. 8, 1999

Related U.S. Application Data

(63) Continuation of application No. PCT/DE99/00568, filed on Mar. 3, 1999.

(51) Int. Cl.$^7$ .................. H01L 27/045; H01L 29/47; H01L 31/07; H01L 31/108; H01L 29/76
(52) U.S. Cl. .................. 257/483; 257/409; 257/484
(58) Field of Search ................ 257/483, 484, 257/409, 129, 168, 339

(56) References Cited

U.S. PATENT DOCUMENTS 4,134,123 A * 1/1979 Shannon .................. 257/484

FOREIGN PATENT DOCUMENTS

| DE | 3341089 A | * 5/1985 | ........... H01L/29/06 |
|---|---|---|---|
| DE | 19604044 A1 | 8/1997 | |
| EP | 0037115 A1 | 10/1981 | |
| FR | 2361750 | 8/1977 | |
| WO | WO 96/26547 | 8/1996 | |

* cited by examiner

Primary Examiner—Tom Thomas
Assistant Examiner—Shouxiang Hu
(74) Attorney, Agent, or Firm—Herbert L. Lerner; Laurence A. Greenberg; Werner H. Stemer

(57) ABSTRACT

A high-voltage edge termination structure for planar structures. The planar structures have a semiconductor body of a first conductivity type whose edge area is provided with at least one field plate isolated from the semiconductor body by an insulator layer. The edge area of the semiconductor body is provided with floating regions of a second conductivity type. The floating regions are spaced at such a distance from one another that zones between the floating regions are depleted even at an applied voltage which is low in comparison with a breakdown voltage of the semiconductor body for the floating regions.

14 Claims, 4 Drawing Sheets

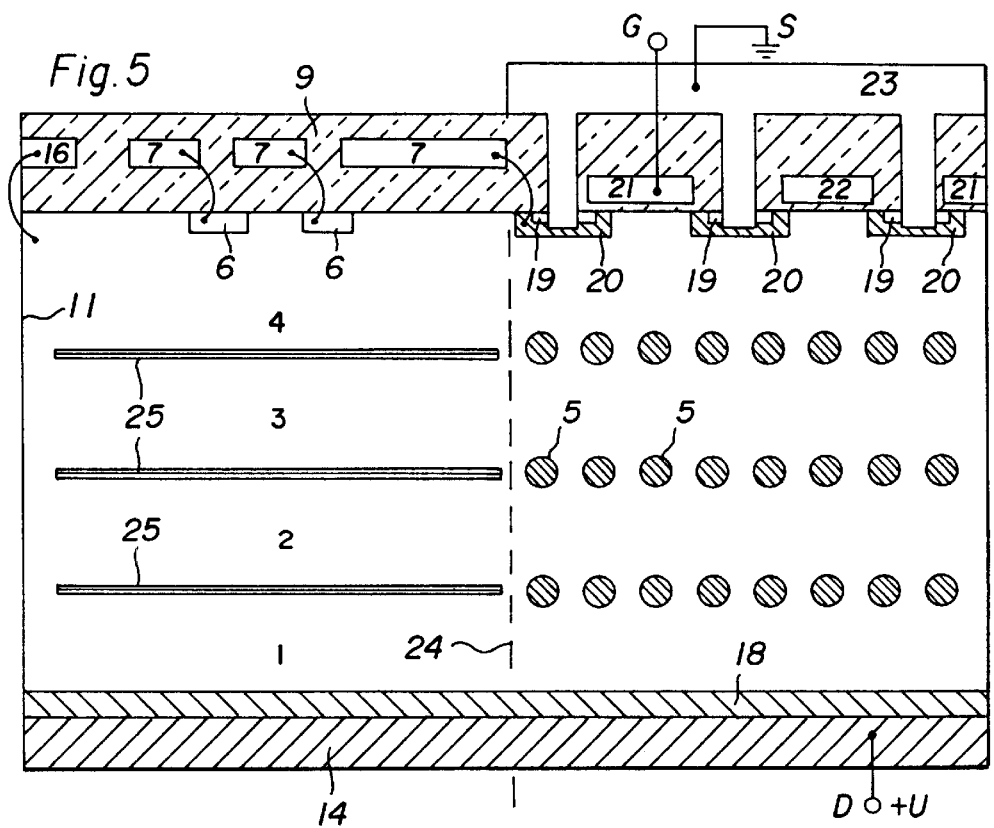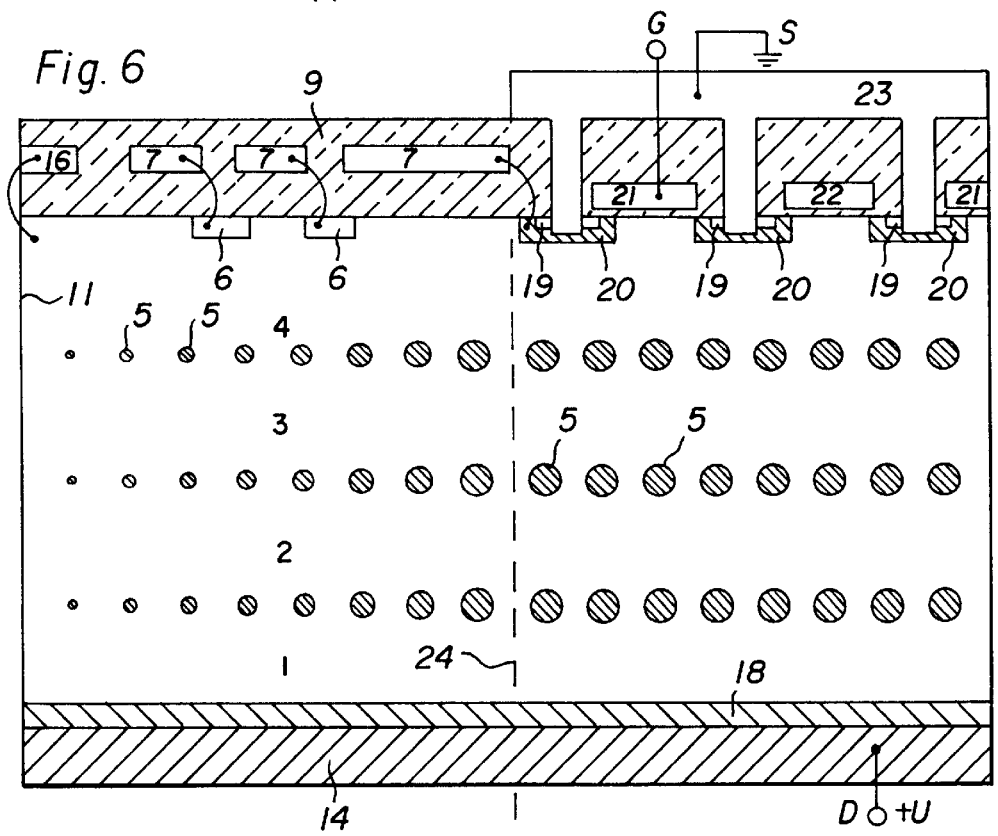

HIGH-VOLTAGE EDGE TERMINATION FOR PLANAR STRUCTURES

CROSS-REFERENCE TO RELATED APPLICATION

This is a continuation of copending International Application PCT/DE99/00568, filed Mar. 3, 1999, which designated the United States.

BACKGROUND OF THE INVENTION

FIELD OF THE INVENTION

The present invention relates to a high-voltage edge termination for planar structures formed of a semiconductor body of one conductivity type whose edge area is provided with at least one field plate isolated from the latter by an insulator layer.

For decades now, efforts have been made to configure the field-strength profile obtained in the semiconductor body in the case of semiconductor components, such as diodes, such that breakdown does not take place in the edge area but rather in the main structure or—in the case of integrated configurations—in the cell array. This is because the curves in the electric field which are inevitably present at the edge structure make the latter particularly susceptible to breakdown, so that moving the breakdown region into the main structure or the cell array simultaneously increases the breakdown strength of the semiconductor component.

A long-standing procedure for increasing the breakdown strength of the edge area of semiconductor components is provided by the use of field plates. Other measures for increasing the dielectric strength of edge structures in semiconductor components relate to the use of guard rings, which may possibly be connected to the field plates, the avoidance of pn-junctions with a large curvature in order to prevent field-strength peaks, etc. (see also Published, European Patent Application EP 0,037,115 A, for example).

Although intensive work has thus been carried out for a long time to increase the breakdown strength of the edge area of semiconductor components, there are still no entirely satisfactory results to date. It is still being contemplated how the breakdown strength of edge structures in semiconductor components can be easily increased.

Thus, the present invention is based on the object of creating a high-voltage edge termination structure for planar structures, which can be used to improve further the breakdown strength of semiconductor components in their edge area.

SUMMARY OF THE INVENTION

It is accordingly an object of the invention to provide a high-voltage edge termination for planar structures which overcomes the above-mentioned disadvantages of the prior art devices of this general type.

With the foregoing and other objects in view there is provided, in accordance with the invention, a high-voltage edge termination structure for planar structures, including:

a semiconductor body having an edge area and formed of a first conductivity type;

an insulator layer disposed on the semiconductor body;

at least one field plate isolated from the semiconductor body by the insulator layer; and floating regions of a second conductivity type disposed in the edge area of the semiconductor body, the floating regions spaced at such a distance from one another that zones between the floating regions being depleted even at an applied voltage which is low in comparison with a breakdown voltage of the semiconductor body for the floating regions.

The invention achieves this object with a high-voltage edge termination for planar structures of the type mentioned in the introduction in that the edge area of the semiconductor body with the floating (or zero-potential) regions of the second conductivity type which are spaced to be at such a distance from one another that the zones between the floating regions are depleted even at an applied voltage which is low in comparison with the breakdown voltage of the semiconductor body for the floating regions.

When a voltage is applied, the floating regions, which can be provided in the manner of islands or else cohesively in a wedge shape with a narrowing thickness toward the edge on a plurality of essentially mutually parallel levels, act as though the edge area itself was undoped. The result of this is that, for the first time, the breakdown now takes place not in the edge area but rather in the center of a semiconductor component.

When insular regions of the second conductivity type are used, they may have essentially the same shape, for example spherical or elliptical. Similarly, it is also possible for the floating regions to have different shapes.

The floating regions also do not need to be completely depleted when a voltage is applied. This particularly applies to voltages that are significantly below the breakdown voltage in the central area of the semiconductor component.

The insular floating regions can also be of a cohesive configuration if appropriate. They are then in the form of a network or lattice. Furthermore, the insular regions can also extend into the central area of the semiconductor body of the semiconductor component.

Instead of configuring the floating regions to be wedge-shaped, they can also be provided with the same layer thickness and, for this, the surface doping can be decreased from, for example, $10^{12}$ cm$^{-2}$ down to 0 toward the edge. Such weaker doping toward the edge can also be provided for insular floating regions. In the same way, it is also possible to have the number of floating regions decrease toward the edge with the same doping or else progressively weaker doping. Hence, it is essential that the doping quantity introduced by the floating regions decreases toward the edge of the semiconductor component.

If appropriate, it is also possible to provide an injector or a Schottky contact which is capable of weakly injecting charge carriers of the second conductivity type in order thereby to prevent complete suppression of the current path when the space-charge zones are empty in the turned-on state.

The field plate provided in the insulator layer can be configured such that its distance from the semiconductor body becomes greater gradually or continuously as the edge of the semiconductor component is approached. It is also possible to provide stepped field plates made of a plurality of materials and, if appropriate, to connect them using guard rings. If one conductivity type is the n-conductivity type, then the guard rings are formed by p-conductive guard rings.

If the floating regions are on a plurality of essentially mutually parallel levels, then, when a voltage is applied to the semiconductor component between the anode and the cathode, for example, the space-charge zone in the semiconductor area between the cathodic surface of the semiconductor body and the first level of the floating regions is depleted first, in the case of an n-conductive semiconductor body. If the space-charge zone reaches the floating regions, then the potential remains at the value Vpth adopted at that time. Subsequently, the space-charge zone between the first level of floating regions and the second level develops. If the second level is reached by the space-charge zone, then the potential remains at a value of about 2 $V_{pth}$, so long as the individual levels are at essentially the same distance from one another.

In this manner, the whole edge area is successively depleted, so that the breakdown voltage can be increased to approximately N+1 times the normal value determined by the doping, assuming that N represents the number of levels.

If there is an injector, this serves, in an n-conductive semiconductor body, as a hole supplier for discharging the p-conductive floating regions in the turned-on state.

Suitable dimensions for the floating regions, if they are of insular construction, are a diameter of about 5 μm for the spherical floating regions, with a mutual distance apart also of about 5 μm, and the surface doping in the floating regions can be about $10^{12}$ to $10^{13}$ cm$^{-2}$.

The edge termination according to the invention can advantageously be used, by way of example, in super high-voltage insulated gate bipolar transistor (IGBT) or high-voltage field-effect transistors etc.

Other features which are considered as characteristic for the invention are set forth in the appended claims.

Although the invention is illustrated and described herein as embodied in a high-voltage edge termination for planar structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a sectional view of a fifth illustrative embodiment of the edge termination for a super high-voltage IGBT;

FIG. 6 is a sectional view of a sixth illustrative embodiment of the edge termination for the super high-voltage IGBT;

DESCRIPTION OF THE PREFERRED EMBODIMENTS

Figure 1:
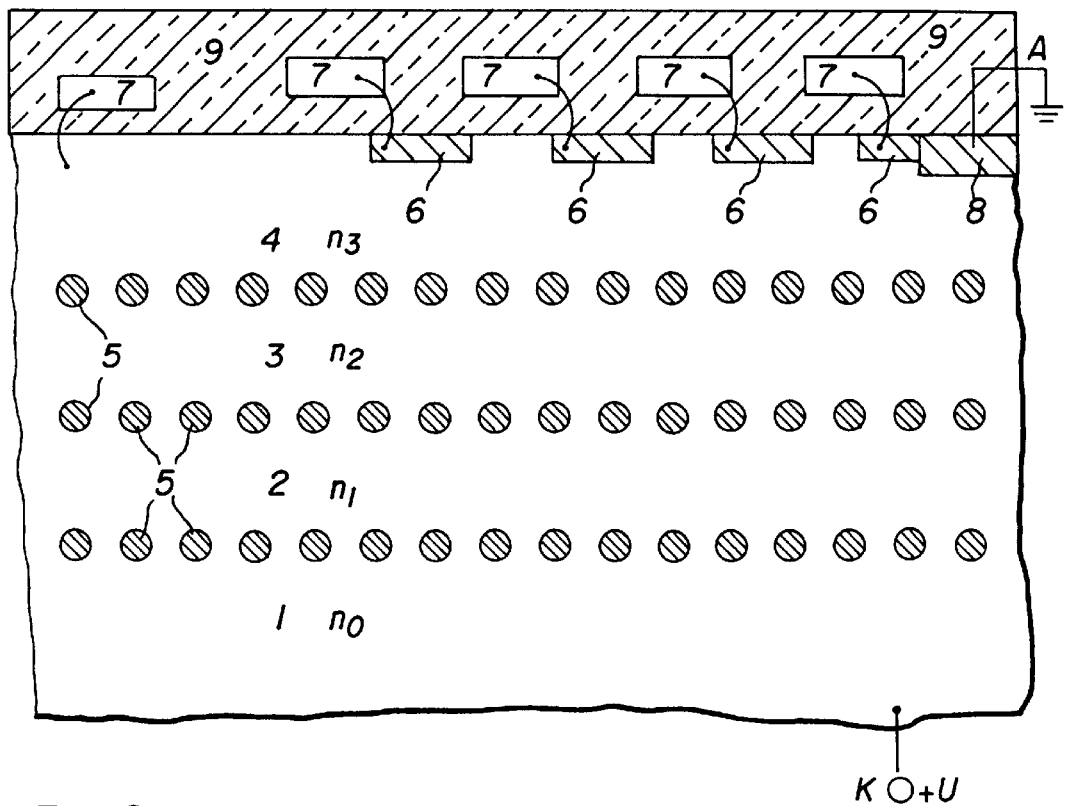
FIG. 1 is a diagrammatic, fragmented, sectional view of a first illustrative embodiment of an edge termination according to the invention.

In all the figures of the drawing, sub-features and integral parts that correspond to one another bear the same reference symbol in each case. The figures inherently show sectional illustrations, in some cases hatching of the individual semiconductor areas, metalizations, etc. have been omitted to improve clarity. Referring now to the figures of the drawing in detail and first, particularly, to FIG. 1 thereof, there is shown a first illustrative embodiment of an edge termination according to the invention. In this case—as also in the rest of the figures—the edge area is placed on the left-hand side and the area of the actual component, i.e. a cell array, is placed on the right-hand side. On an n-conductive semiconductor substrate 1 having a doping concentration $n_0$, there are, in succession, a first n-conductive epitaxial layer 2 having a doping concentration $n_1$, a second n-conductive epitaxial layer 3 having a doping concentration $n_2$, and a third n-conductive epitaxial layer 4 having a doping concentration $n_3$. Embedded in each case between the semiconductor substrate 1 and the first epitaxial layer 2, between the first epitaxial layer 2 and the second epitaxial layer 3 and between the second epitaxial layer 3 and the third epitaxial layer 4, there are insular p-conductive regions 5 which are each doped before the subsequent epitaxial layer is applied. The p-conductive regions 5 may possibly also be configured to be cohesive in the manner of a lattice or network. At any rate, in the present illustrative embodiment, the regions 5 are present on three levels.

The substrate 1 is connected to a cathode electrode K, which has a voltage+U applied to it. Embedded in the third epitaxial layer 4, there are p-conductive guard rings 6 which are each connected to field plates 7 made of polycrystalline silicon. The outermost field plate 7 can then be at the same potential as the third epitaxial layer 4. Finally, a p-conductive anode zone 8 is also connected to an anode electrode A.

In this configuration, if a voltage is applied between the anode A and the cathode K, a space-charge zone firstly develops between that surface of the semiconductor body which adjoins an insulator layer 9 made of silicon dioxide, that is to say the surface of the third epitaxial layer 4, and the insular regions 5 between the second epitaxial layer 2 and the third epitaxial layer 4. If the space-charge zone reaches the floating regions 5 of the top level at a voltage $V_{pth}$, then the potential of the insular regions 5 of the top level remains at the value $V_{pth}$. After this, the space-charge zone forms between the regions 5 of the third level and the regions 5 of the second level, that is to say the regions situated between epitaxial layers 2 and 3. If the second level is reached, then the potential remains at about 2 $V_{pth}$ etc.

In this way, the entire edge structure is depleted, so that the breakdown voltage there at the three levels increases roughly fourfold.

The diameters of the floating regions 5 can be about 5 μm, while their distance from one another on the same level can also be 5 μm. The surface doping of the floating regions 5 is roughly $10^{12}$ to $10^{13}$ cm$^{-2}$.

It is also possible, if appropriate, to extend the floating regions 5 to a central structure of the semiconductor component, that is to say toward the right-hand side in the figures.

Figure 2:
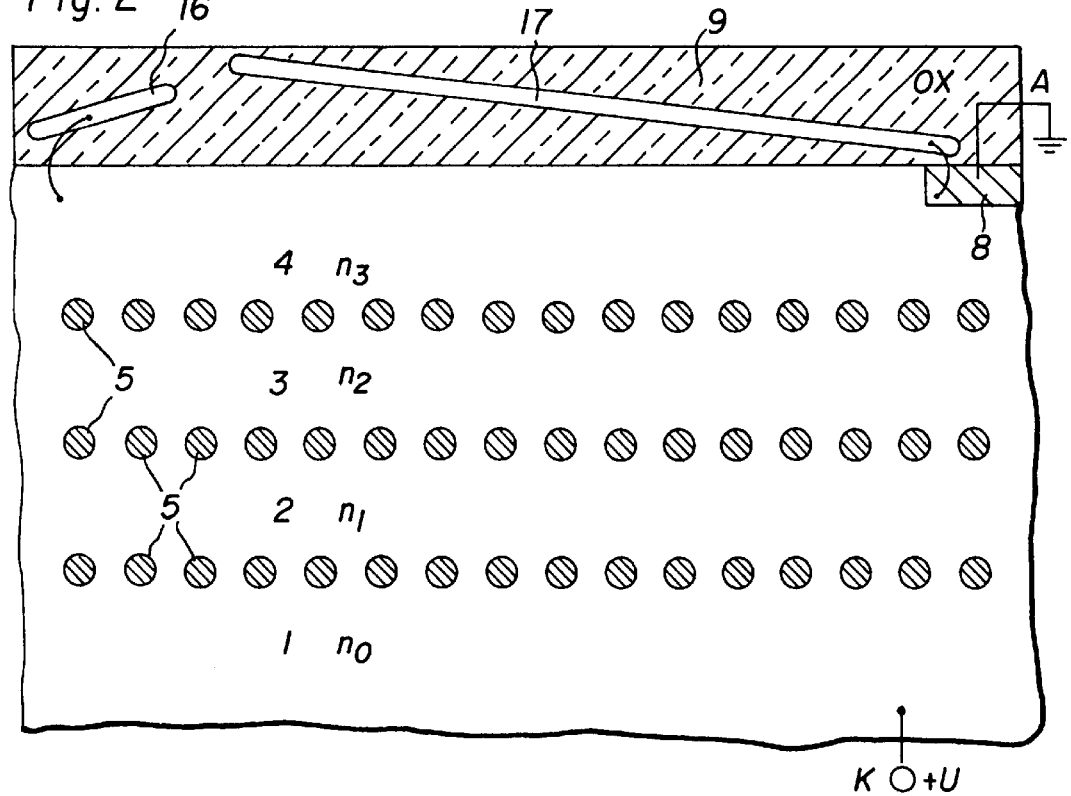
FIG. 2 is a fragmented, sectional view of a second illustrative embodiment of the edge termination.

FIG. 2 shows a similar second illustrative embodiment to that of FIG. 1, differing from the latter only in that only one field plate 17 is used together with a channel stopper 16 connected to the potential of the semiconductor body.

Figure 3:
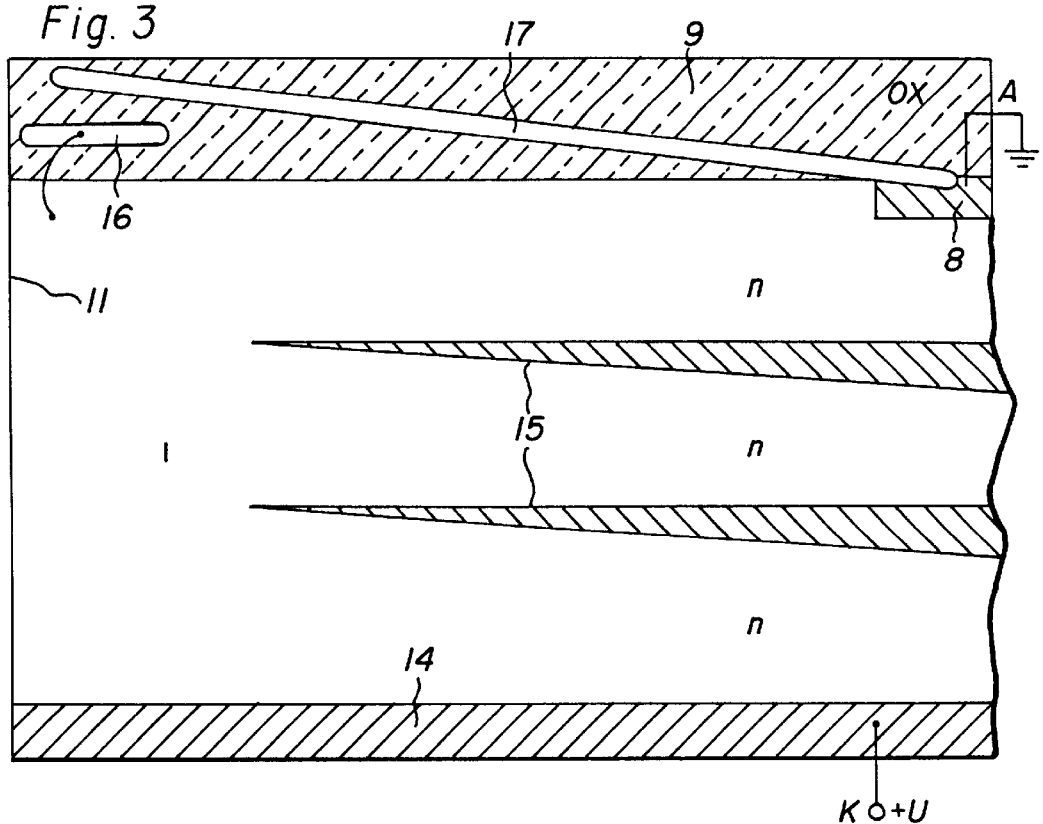
FIG. 3 is a fragmented, sectional view of a third illustrative embodiment of the edge termination.

FIG. 3 shows a third illustrative embodiment of the edge termination according to the invention having an edge 11 and wedge-shaped, floating p-conductive regions 15, which in this case are disposed on two levels. The space-charge zones are established between the individual levels in the same way here as explained above with reference to FIG. 1.

A cathode contact 14 which can be made of aluminum and functions as a weak injector in order to act as a hole supplier for discharging the p-conductive regions 15 in the turned-on state.

In a similar manner to in the illustrative embodiments shown in FIGS. 1 and 2, a lattice-like structure of floating regions 5 can extend toward the center of the semiconductor component on the levels formed by the regions 15 (not shown in FIG. 3). The same also applies to the illustrative embodiments below.

The channel stopper 16 provided in the third illustrative embodiment can be omitted, if appropriate.

Figure 4:
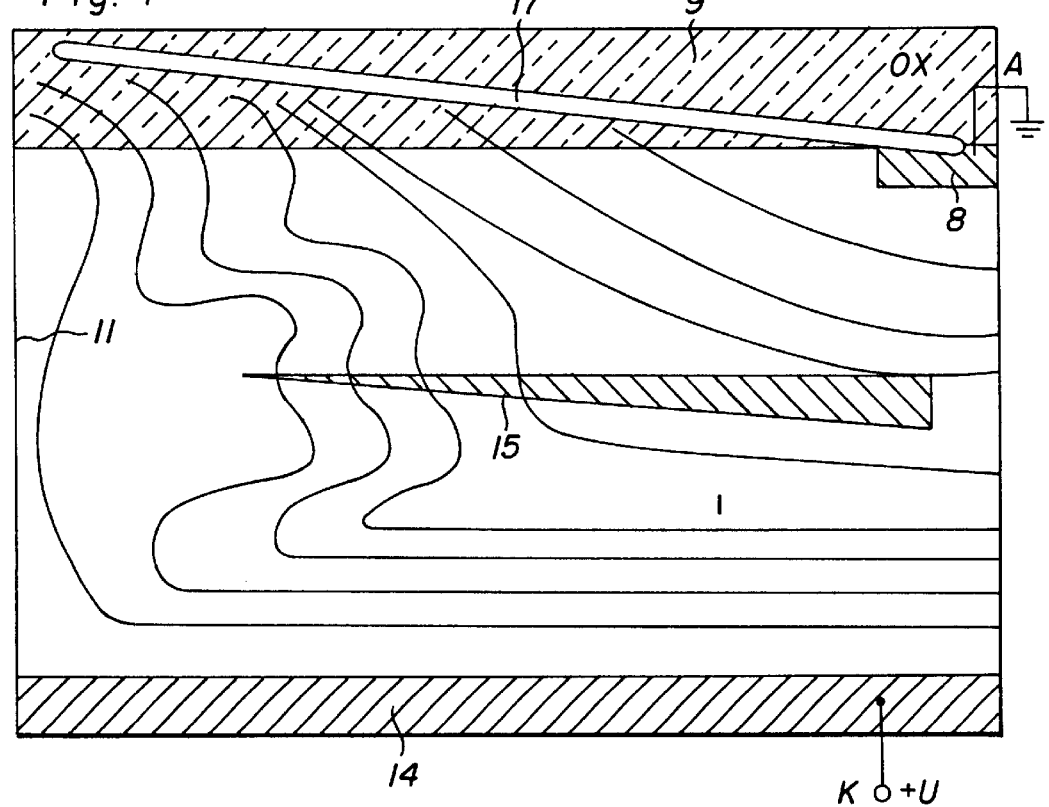
FIG. 4 is a sectional view of a course of field lines in a fourth illustrative embodiment of the edge termination.

As a fourth illustrative embodiment, FIG. 4 shows an edge termination having the wedge-shaped region 15 on only one level, and it also shows the potential line course (equipotential lines) established after a voltage is applied. This can be a voltage value of 2000 V, for example.

FIG. 4 shows that the potential lines run essentially perpendicularly to the surface, so that breakdown does not occur in the edge area.

As a fifth illustrative embodiment, FIG. 5 shows the high-voltage edge termination for a super high-voltage IGBT. Instead of the wedge-shaped p-conductive regions 15, floating p-conductive layered regions 25 are provided here whose doping decreases toward the edge 11. Hence, the doping of these regions 25 can decrease from a surface doping of about $10^{13}$ to $10^{12}$ cm$^{-2}$ starting from their right-hand edge (see dashed line 24) down to a value of 0 at the edge 11.

The layers 25 can extend toward the component side, that is to say in the opposite direction to the edge 11, in the manner of islands in the form of regions 5, which may possibly be connected to one another in a lattice form.

FIG. 5 also shows a source metalization 23, a gate electrode 22 made of polycrystalline silicon, polycrystalline silicon layers 21, n-conductive source regions 20 and p-conductive regions 19. In addition, a drain contact D having a p-conductive layer 18 is provided.

FIG. 6 shows a sixth illustrative embodiment of the high-voltage edge termination according to the invention, but in this case the p-conductive regions 25 are replaced by the insular p-conductive regions 5 whose doping decreases toward the edge 11, as indicated schematically by the ever decreasing size shown for the layers 5.

Figure 7:
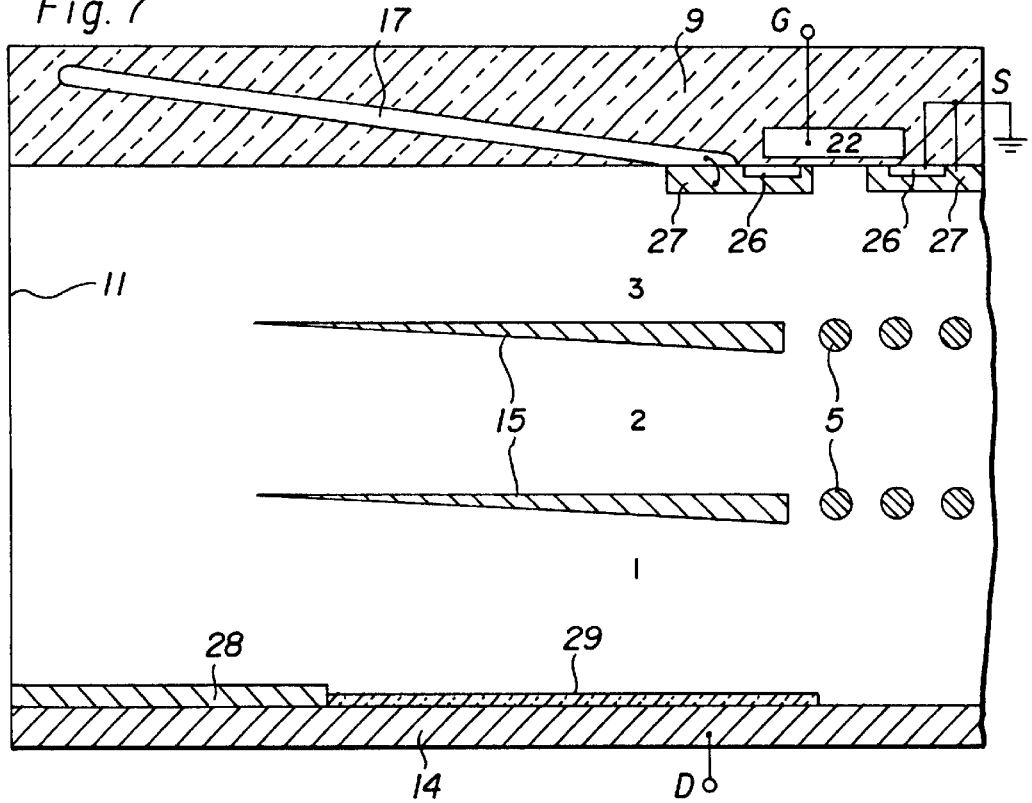
FIG. 7 is a fragmented, sectional view of a seventh illustrative embodiment of the edge termination for the high-voltage field-effect transistor having an injector.
Figure 8:
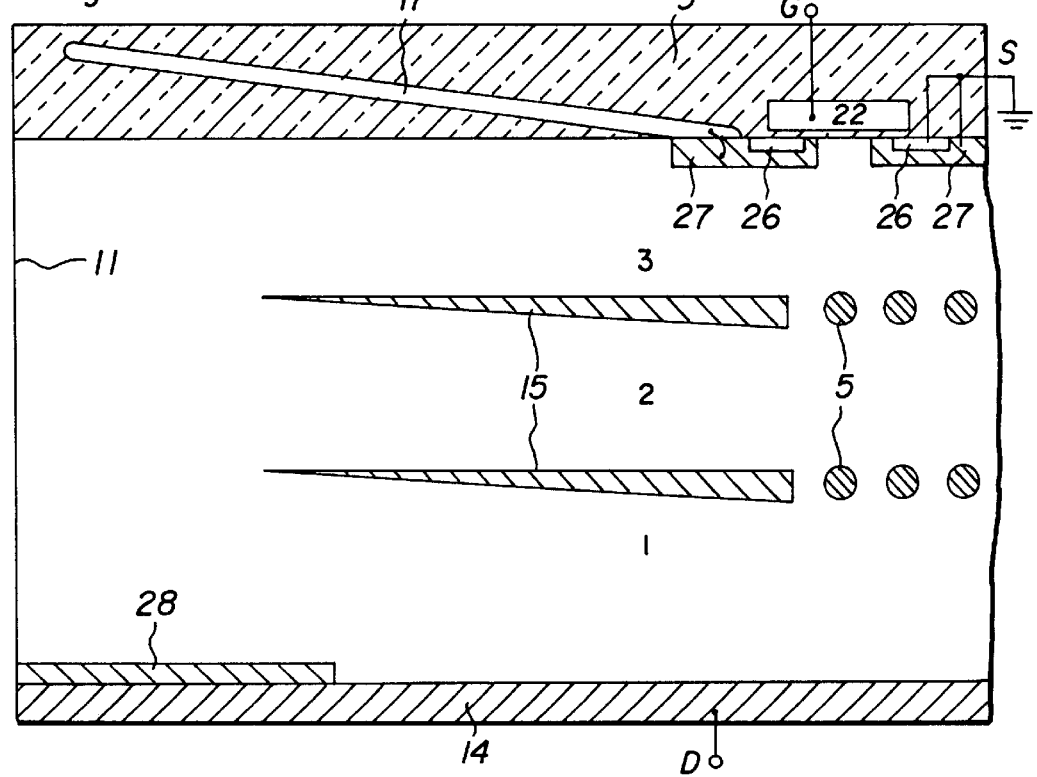
FIG. 8 is a fragmented, sectional view of an eighth illustrative embodiment of the edge termination for the high-voltage field-effect transistor having an injector.

FIGS. 7 and 8 show seventh and eighth illustrative embodiments of the high-voltage edge termination according to the invention for a high-voltage field-effect transistor having an injector. These illustrative embodiments are similar to the illustrative embodiment shown in FIG. 3 and have the oblique field plate 17 in the insulator layer 9, with the channel stopper 16 possibly being provided as well. At any rate, they have the wedge-shaped p-conductive regions 15 that merge into the insular regions 5 in the central area.

A source contact S is connected to n-conductive regions 26 and p-conductive regions 27 and is grounded. A drain electrode D is connected to the semiconductor substrate 1 via the aluminum contact 14. Furthermore, there is also a p-conductive injector layer 28 which further amplifies the weakly injecting injector of the third illustrative embodiment shown in FIG. 3. In addition, a Schottky contact may possibly be provided instead of the p-conductive layer 28. Part of the aluminum contact 14 is also covered by an insulator layer 29.

The illustrative embodiment shown in FIG. 8 differs from the illustrative embodiment shown in FIG. 7 in that it has no insulator layer 29. The illustrative embodiment shown in FIG. 8 can also be provided with a Schottky contact instead of the p-conductive layer 28.

I claim:

1. A high-voltage edge termination structure for planar structures, comprising:

a semiconductor body having an edge area and formed of a first conductivity type;

an insulator layer disposed on said semiconductor body;

at least one field plate isolated from said semiconductor body by said insulator layer; and floating regions of a second conductivity type disposed in said edge area of said semiconductor body, each one of said floating regions disposed on one of a plurality of substantially mutually parallel levels and spaced at a distance from one another causing zones between said floating regions to be completely depleted to form space-charge zones at an applied voltage which is low in comparison with a breakdown voltage of said floating regions.

2. The high-voltage edge termination structure according to claim 1, wherein said semiconductor body has a central area and said floating regions extend into said central area of said semiconductor body.

3. The high-voltage edge termination structure according to claim 1, wherein said semiconductor body has an edge and said floating regions have a wedge-shaped configuration with a narrowing thickness toward said edge of said semiconductor body.

4. The high-voltage edge termination structure according to claim 1, wherein said semiconductor body has an edge and said floating regions are of a layered configuration with a doping which becomes weaker toward said edge of said semiconductor body.

5. The high-voltage edge termination structure according to claim 1, wherein said semiconductor body has an edge and said floating regions each have a surface doping that decreases toward said edge of said semiconductor body from roughly between $10^{12}$ and about $10^{13}$ cm$^{-2}$ to 0.

6. The high-voltage edge termination structure according to claim 1, wherein said at least one field plate is a plurality of field plates each having guard rings of said second conductivity type connected thereto.

7. The high-voltage edge termination structure according to claim 1, including an injector disposed on said semiconductor body for injecting charge carriers of said second conductivity type.

8. The high-voltage edge termination structure according to claim 1, including a Schottky contact disposed on said semiconductor body for injecting charge carriers of said second conductivity type.

9. The high-voltage edge termination structure according to claim 1, wherein said floating regions are islands embedded in said edge area of said semiconductor body.

10. The high-voltage edge termination structure according to claim 9, wherein said semiconductor body has an edge and said floating regions become smaller toward said edge of said semiconductor body.

11. The high-voltage edge termination structure according to claim 9, wherein said floating regions are substantially spherical shaped.

12. The high-voltage edge termination structure according to claim 11, wherein the distance between said floating regions is about 5 µm.

13. The high-voltage edge termination structure according to claim 11, wherein said floating regions have a diameter of about 5 µm.

14. The high-voltage edge termination structure according to claim 13, wherein said floating regions have a surface doping of about $10^{12}$ to $10^{13}$ cm$^{-2}$.

* * * * *

UNITED STATES PATENT AND TRADEMARK OFFICE
CERTIFICATE OF CORRECTION

PATENT NO. : 6,376,890 B1
DATED : April 23, 2002
INVENTOR(S) : Jenoe Tihanyi

It is certified that error appears in the above-identified patent and that said Letters Patent is hereby corrected as shown below:

<u>Title page,</u>
Item [30], should read as follows:

-- Apr. 8, 1998   (DE) ……… 198 15 851--

Signed and Sealed this

Third Day of September, 2002

Attest:

Attesting Officer

JAMES E. ROGAN
*Director of the United States Patent and Trademark Office*